United States Patent
Yamazaki et al.

(10) Patent No.: US 11,402,751 B2
(45) Date of Patent: Aug. 2, 2022

(54) IMPRINT MOLD-FORMING SYNTHETIC QUARTZ GLASS SUBSTRATE

(71) Applicant: Shin-Etsu Chemical Co., Ltd., Tokyo (JP)

(72) Inventors: Hiroyuki Yamazaki, Joetsu (JP); Masao Ando, Joetsu (JP); Daiyu Okafuji, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 140 days.

(21) Appl. No.: 17/030,845

(22) Filed: Sep. 24, 2020

(65) Prior Publication Data

US 2022/0091501 A1    Mar. 24, 2022

(51) Int. Cl.
  *C03C 15/00*  (2006.01)
  *G03F 7/00*  (2006.01)
  *C03C 3/06*  (2006.01)

(52) U.S. Cl.
  CPC .............. *G03F 7/0002* (2013.01); *C03C 3/06* (2013.01); *C03C 15/00* (2013.01); *C03C 2201/02* (2013.01); *Y10T 428/24479* (2015.01)

(58) Field of Classification Search
  CPC ........ C03C 3/06; C03C 15/00; C03C 2201/02; Y10T 428/24479
  See application file for complete search history.

(56) References Cited

U.S. PATENT DOCUMENTS

| | | | |
|---|---|---|---|
| 2002/0155361 A1 | 10/2002 | Takeuchi et al. | |
| 2005/0020083 A1* | 1/2005 | Numanami | G03F 1/60 451/36 |
| 2013/0011773 A1 | 1/2013 | Nakanishi et al. | |

FOREIGN PATENT DOCUMENTS

| | | |
|---|---|---|
| JP | 2002-318450 A | 10/2002 |
| JP | 2005-43838 A | 2/2005 |
| WO | 2011/115131 A1 | 9/2011 |

* cited by examiner

*Primary Examiner* — Frank J Vineis
*Assistant Examiner* — Donald M Flores, Jr.
(74) *Attorney, Agent, or Firm* — WHDA, LLP

(57) ABSTRACT

In an imprint mold-forming synthetic quartz glass substrate (1) of rectangular shape having dimensions L1 and L2 with L1≥L2, a circular region is delineated on the substrate back surface by a circle of radius R with L2−2R≥10 mm. When approximation analysis is performed from the 1st to 8th term in the Zernike polynomials on the circular region, a coefficient of the 4th term is equal to or greater than −(2R/100,000×1) μm.

11 Claims, 3 Drawing Sheets

IMPRINT MOLD-FORMING SYNTHETIC QUARTZ GLASS SUBSTRATE

TECHNICAL FIELD

This invention relates to an imprint mold-forming synthetic quartz glass substrate.

BACKGROUND ART

The imprint technology is one of recent advanced technical substitutes for the photolithography. Molds used in the imprint technology are formed from substrates of various shapes. Often substrates are machined on their front surface, back surface, side surface and chamfer.

In the imprint technology, a mold is obtained by imprinting a concave/convex pattern of micrometer or nanometer size on the surface of a substrate. The mold is pressed to a recipient or a resin layer coated on a surface thereof for thereby transferring the fine pattern precisely at a time. Particularly when the UV nanoimprint process is utilized in the IC application where fine patters are necessary, molds of synthetic quartz glass are advantageous because of low thermal expansion, purity, heat resistance and chemical resistance.

The imprint process has advantages such as cost reduction due to reduction of steps and high transfer reproducibility as compared with prior art processes. However, since the imprint technology is based on 1:1 direct contact between mold and recipient, there are inherent problems, which are not found in the conventional photolithography, such as various defects and the requirement of high topological accuracy over the entire mold.

The imprint mold preparing process involves engraving of a concave/convex pattern, which is often carried out by photolithography using a semiconductor device fabrication apparatus or equivalent and wet etching. The pattern alignment accuracy required for the semiconductor device fabrication is of the order of several hundred to several nanometers. Not only the processing accuracy of fine pattern is required, but also profiles of high accuracy covering from front and back surfaces to side surfaces of a mold are prescribed.

Primarily in the IC application, the flatness of both front and back surfaces of a photomask is regarded important. For example, Patent Document 1 discloses a flattening technique for achieving a high flatness as required in the exposure region of a photomask. Patent Document 2 describes that the flatness of a clamping region of a substrate along its outer periphery is important. Patent Document 3 describes the advanced reflection exposure system like EUV lithography and prescribes that the guarantee region of the back surface has a flatness of up to 300 nm.

CITATION LIST

Patent Document 1: JP-A 2002-318450 (U.S. Pat. No. 6,869,752)
Patent Document 2: JP-A 2005-043838
Patent Document 3: WO 2011/115131

SUMMARY OF INVENTION

For photomask substrates of transmission type, the flatness of a front surface where a pattern is to be drawn is regarded important whereas the flatness of a back surface is not prescribed as severely as that of the front surface. The portion in the back surface where flatness is regarded critical is limited to the outer periphery of the substrate which is subject to clamping. In this connection, Patent Document 1 refers to only the front surface, but not to the back surface.

Patent Document 2 describes the peripheral clamping region of a substrate on the front surface, but refers nowhere to the back surface. This is because in the photolithography, the substrate back surface is a non-contact portion. It is believed that even if the back surface has any influence on the pattern, such influence can be fully cancelled by optical correction in the exposure tool and a choice of illumination.

For the reflection type masks used in EUV lithography, the guarantee region on the back surface is prescribed to a flatness as high as on the front surface. Patent Document 3 describes that high flatness is necessary on both front and back surfaces, with smaller values of flatness being better. There is neither requirement nor description of the shape of the back surface.

On the other hand, the imprint mold process includes the steps of forcing a pattern on a mold in physical contact with a recipient side and pulling back the mold. Unlike the photomask, it is necessary to secure the back surface widely and tightly. The securing means may be suction or mechanical holding. In the case of suction holding, the contact between the back surface and the suction table is often necessary. In the case of mechanical holding, the contact between the back surface and the pusher table is often necessary for physical pressing. At this point, the substrate back surface and a member of a stage or table in contact therewith are deformed by geometric factors and pressing stresses. The pattern-bearing surface on the front surface is also deformed by deformation of the substrate. As a result of surface deformation, the pattern on the front surface is also deformed, causing a misalignment of the pattern in plane direction. Particularly in the case of back surface shape of low central symmetry, the pattern undergoes non-linear shifts. In the case of the back surface of concave shape, the deformation state changes on every suction holding. The reproducibility of a pattern misalignment is low. In either case, pre- or post-correction or modification is difficult.

In the fine pattern formation including the IC application where the allowance for pattern misalignment is as severe as of the order of a few nanometers, the above-discussed problems can be critical in the fine pattern transfer technology.

An object of the invention is to lay out a shape (or topography) necessary for imprint molds and to provide an imprint mold-forming synthetic quartz glass substrate based thereon.

The inventors have found the back surface shape of a synthetic quartz glass substrate best suited for imprint molds.

The invention provides an imprint mold-forming synthetic quartz glass substrate of rectangular shape having a longitudinal dimension L1 and a lateral dimension L2 wherein L1≥L2, the substrate having a front surface where a mold pattern is to be formed, a back surface opposed thereto, and a center. Let a circular region be delineated on the back surface by a circle having a radius R from the substrate center wherein L2−2R≥10 mm, and let approximation analysis be performed from the 1st to 8th term in the Zernike polynomials on the circular region, then a coefficient of the 4th term is equal to or greater than −(2R/100,000×1) μm.

In a preferred embodiment, coefficients of the 5th to 8th terms are in the range from −(2R/100,000×1) μm to (2R/100,000×1) μm. Also preferably, the summation of absolute values of coefficients of the 5th to 8th terms is equal to or less than $4\times(2R/100,000\times1)$ μm.

In one embodiment, the substrate includes a stepped region in the circular region, a step being machined in the stepped region. Typically, the step is a non-through bore or through bore.

In another preferred embodiment wherein approximation analysis is performed from the 1st to 8th term in the Zernike polynomials on a region that is equal to the circular region minus the stepped region, a coefficient of the 4th term is equal to or greater than $-(2R/100,000\times0.6)$ μm. Preferably, coefficients of the 5th to 8th terms are equal to or greater than $-(2R/100,000\times0.6)$ μm. Also preferably, the summation of absolute values of coefficients of the 5th to 8th terms is equal to or less than $4\times(2R/100,000\times0.6)$ μm.

In a further preferred embodiment wherein approximation analysis is performed from the 1st to 8th term in the Zernike polynomials on an annular region which is delineated between an arbitrary circle having a radius R1 and a concentric circle having a radius R2 wherein R2−R1=10 mm, within a region that is equal to the circular region minus the stepped region, a coefficient of the 4th term is equal to or greater than $-(2R/100,000\times0.5)$ μm. Preferably, coefficients of the 5th to 8th terms are in the range from $-(2R/100,000\times0.2)$ μm to $(2R/100,000\times0.2)$ μm. Also preferably, the summation of absolute values of coefficients of the 5th to 8th terms is equal to or less than $4-(2R/100,000\times0.2)$ μm.

Advantageous Effects of Invention

The imprint mold-forming synthetic quartz glass substrate of the invention enables to reduce the amount of substrate deformation during imprinting step and makes the deformation behavior highly reproducible. These ensure shape reproducibility between the imprint mold pattern and the transferred pattern and process stability.

DESCRIPTION OF PREFERRED EMBODIMENTS

In the following description, like reference characters designate like or corresponding parts throughout the several views shown in the figures. It is understood that terms such as "front," "back," and the like are words of convenience and are not to be construed as limiting terms. The shape such as rectangular or circular shape refers to a geometric shape as viewed in plan view, typically of FIGS. 1 to 3, unless otherwise stated.

Figure 1:
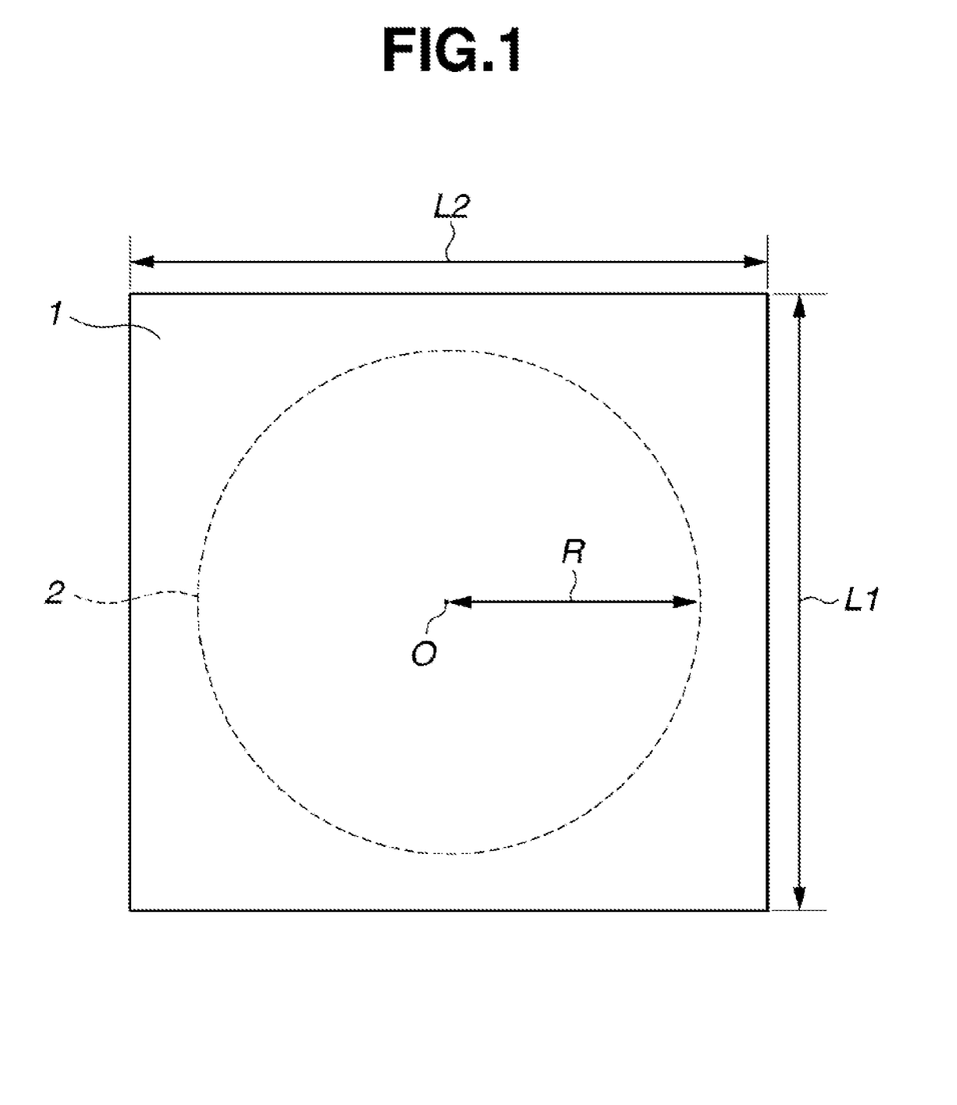
FIG. 1 is a plan view of the back surface of an imprint mold-forming synthetic quartz glass substrate in one embodiment of the invention.

FIG. 1 is a plan view of the back surface of an imprint mold-forming synthetic quartz glass substrate in one embodiment of the invention. The synthetic quartz glass substrate 1 of rectangular shape has a front surface where a mold pattern is to be formed, a back surface opposed thereto, and a center O. The substrate has a longitudinal dimension L1 and a lateral dimension L2 wherein L1≥L2. Let a circular region be delineated on the back surface by a circle having a radius R from the substrate center wherein L2−2R≥10 mm. When approximation analysis is performed from the 1st term to the 8th term in the Zernike polynomials on the circular region, a coefficient of the 4th term is equal to or greater than $-(2R/100,000\times1)$ μm.

With respect to the relationship of longitudinal dimension L1 to lateral dimension L2, L1=L2 is preferred for obtaining more uniform deformation shape, but the relationship is not limited thereto because rectangular substrates like liquid crystal substrates are often used. L1 is preferably in the range of 30 to 3,000 mm, more preferably 100 to 2,000 mm, and L2 is preferably in the range of 100 to 1,500 mm, more preferably 120 to 1,400 mm.

For analysis of flatness of the back surface and Zernike coefficients, Tropel UltraFlat system (Corning Inc.) or the like is used.

The Zernike polynomials are defined as the following formula wherein the degrees and contents of the 1st to 8th terms are as shown in Table 1.

$$W(x, y) = W(\rho \sin \theta, \rho \cos \theta) =$$

$$W(\rho, \theta) = \sum_{n=0}^{k} \sum_{m=-n}^{n} B_{nm} \cdot R_n^m(\rho) \cdot \begin{cases} \cos |m| \theta : m \geq 0 \\ \sin |m| \theta : m < 0 \end{cases}$$

$$R_n^{\pm m}(\rho) = \sum_{i=0}^{\frac{n-m}{2}} (-1)^s \frac{(n-s)! \rho^{n-2s}}{s! \left(\left(\frac{n+m}{2}\right) - s\right)! \left(\left(\frac{n-m}{2}\right) - s\right)!}$$

Herein Bnm is a Fringe Zernike coefficient.

TABLE 1

| Term | Degree n | Degree m | Contents | |
|---|---|---|---|---|
| 1 | 0 | 0 | 1 | constant term |
| 2 | 1 | 1 | $\rho\cos\theta$ | tilt X component |
| 3 | 1 | −1 | $\rho\sin\theta$ | tilt Y component |
| 4 | 2 | 0 | $2\rho^2 - 1$ | focus shift |
| 5 | 2 | 2 | $\rho^2\cos2\theta$ | astigmatism (0° and 90° directions) |
| 6 | 2 | −2 | $\rho^2\sin2\theta$ | astigmatism (±45° direction) |
| 7 | 3 | 1 | $(3\rho^3 - 2\rho)\cos\theta$ | degree 3 coma X component |
| 8 | 3 | −1 | $(3\rho^3 - 2\rho)\sin\theta$ | degree 3 coma Y component |

Investigating the number of terms necessary in the Zernike polynomials, the inventors have found that by approximating the back surface shape as the polynomials up to the 8th term, optimum conditions can be derived for the stabilization of substrate deformation shape in the case of imprinting with the substrate back surface being suction held.

In the Zernike polynomials, the 1st term is a constant term. The 2nd and 3rd terms represent the tilts of X and Y direction planes in a suction hold region (a circular region delineated by a circle having a radius R from the substrate center) in the substrate back surface. The imprint process itself necessitates parallel alignment of the imprint mold side and the recipient side. Since the system performance, process accuracy, and the flatness of the recipient side substrate provide complex factors, it is assumed herein that these factors should be comprehensively discussed and are not considered as the substrate shape.

The 4th term is a term of central symmetry. It serves as an index in formulating a pattern design prior to pattern formation or performing magnification correction as by deforming by applying external forces to the substrate after pattern formation. The magnitude of absolute values must be predetermined for magnification correction because upper limits are imposed on the mechanism and correction during pattern formation.

The 4th term becomes a term approximating to the shape of central symmetry while the degree of convex/concave shape is represented by a coefficient. In the back surface suction holding mechanism having this central symmetry shape, the coefficient of the 4th term and deformation of the substrate become a linear correlation to the substrate front surface. Then the magnification correction from the coefficient is easy before and after pattern formation.

In general, the out-of-guarantee region of the substrate in the IC application often falls within 5 mm from the end surface. The out-of-guarantee region often has a poorer flatness than the in-guarantee region. The outer periphery, which is mounted on or secured to a work holder of apparatus, is stressed upon suction holding or imprinting.

Therefore, the region contributing to deformation of a pattern shape is a circular region 2 which is delineated, as shown in FIG. 1, on the back surface of a synthetic quartz glass substrate 1 of rectangular shape having a longitudinal dimension L1 and a lateral dimension L2, by a circle having a radius R from the substrate center O, approximately excluding the out-of-guarantee region from the back surface.

According to the invention, when approximation analysis is performed from the 1st to 8th term in the Zernike polynomials on the circular region 2, a coefficient of the 4th term is equal to or greater than $-(2R/100.000\times 1)$ pin, preferably from $-(2R/100,000\times 0.5)$ μm to 0 μm. When the coefficient of the 4th term is in the range, the deformation of pattern shape by substrate suction holding consists of parameters which can be corrected before and after pattern formation and so, the pattern alignment accuracy is improved. In the case of a synthetic quartz glass substrate of 6 inch squares, for example, the coefficient of the 4th term is equal to or greater than −1.42 μm, preferably from −0.71 μm to 0 μm.

Figure 2:
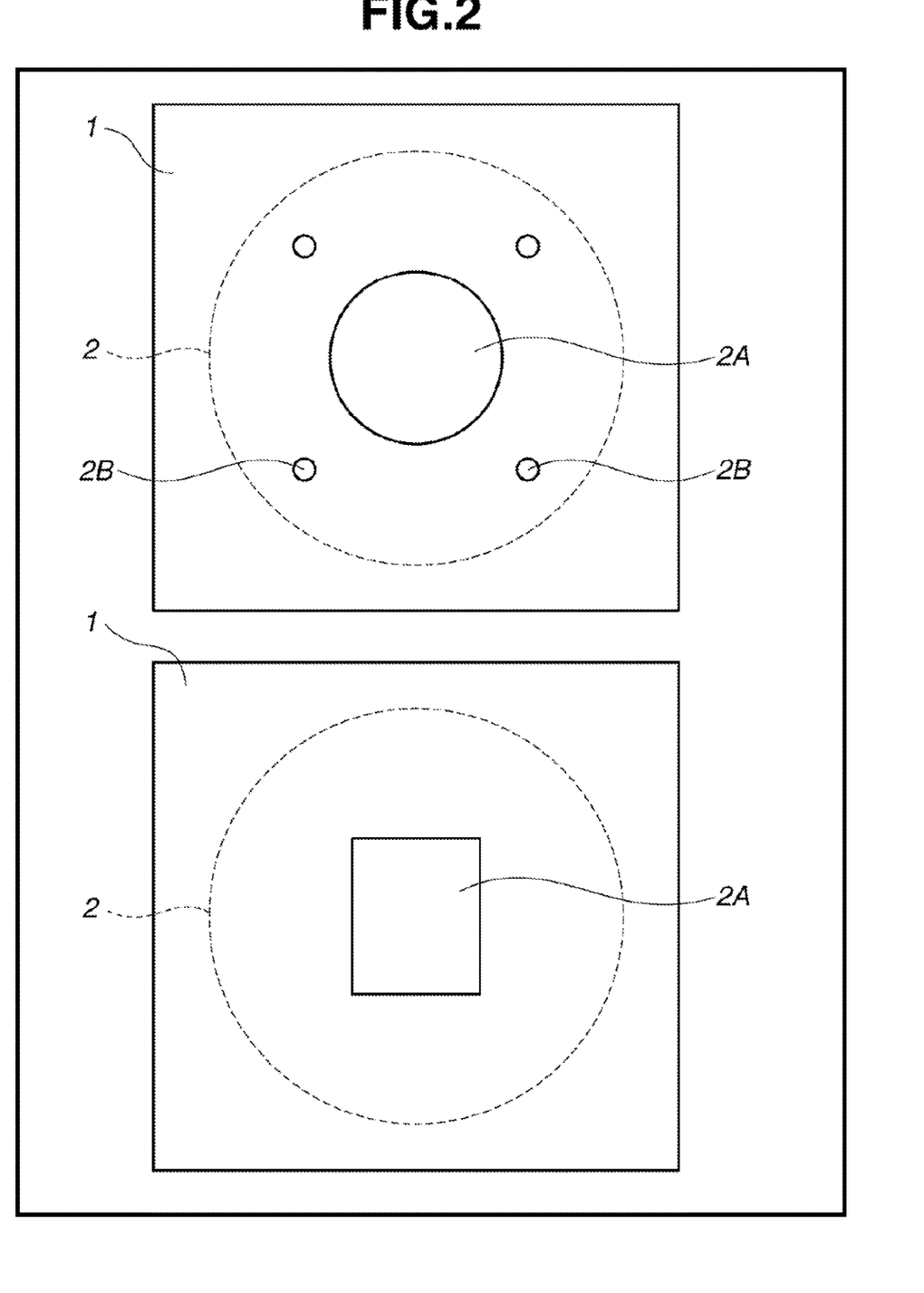
FIG. 2 is a plan view of the substrate back surface where a non-through bore and/or through bores are machined as a step.

Also, for example, step machining is performed in the circular region 2 of the synthetic quartz glass substrate 1 to form a non-through bore (or recess) 2A or through bores 2B as a step, as shown in FIG. 2. When approximation analysis is performed from the 1st to 8th term in the Zernike polynomials on a region that is equal to the circular region 2 minus the stepped region (non-through bore 2A and through bores 2B in FIG. 2), a coefficient of the 4th term is preferably equal to or greater than $-(2R/100.000\times 0.6)$ μm, more preferably from $-(2R/100,000\times 0.4)$ μm to 0 μm. Then the deformation amount on the substrate front surface is stabilized, providing a substrate which can be readily corrected. In the case of a synthetic quartz glass substrate of 6 inch squares, for example, the coefficient of the 4th term in the region that is equal to the circular region minus the stepped region is preferably equal to or greater than −0.86 μm, more preferably from −0.57 μm to 0 μm.

Figure 3:
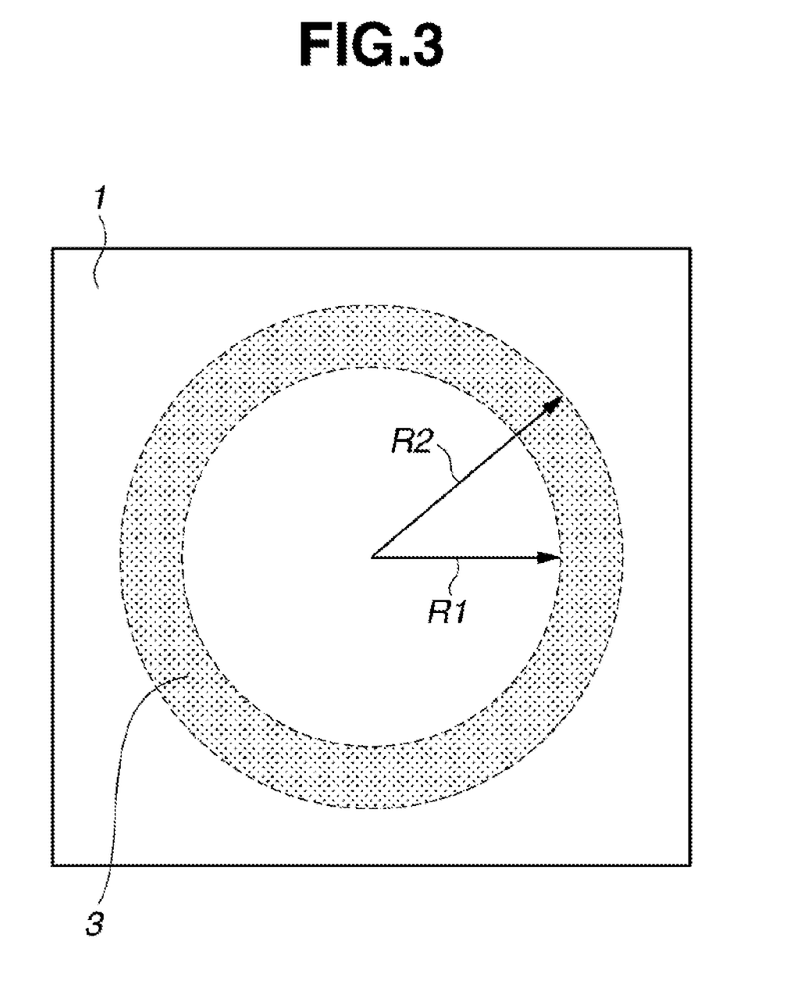
FIG. 3 is a plan view of the substrate back surface where an annular region is delineated between an arbitrary circle of radius R1 and a concentric circle of radius R2 within a region that is equal to the circular region minus the stepped region.

In the case of substrate suction holding, suction begins from the central convex portion of the back surface and proceeds toward the outer periphery. It is a more inside tilt that largely affect the amount of deformation. For example, as shown in FIG. 3, an annular region 3 is delineated between an arbitrary circle having a radius R1 and a concentric circle having a radius R2 wherein R2−R1=10 mm, within a region that is equal to the circular region 2 minus the stepped region. It is preferable to strictly prescribe the tilt in the annular region 3.

Specifically, when approximation analysis is performed from the 1st to 8th term in the Zernike polynomials on the annular region 3, a coefficient of the 4th term is preferably equal to or greater than $-(2R/100,000\times 0.5)$ μm, more preferably from $-(2R/100,000\times 0.5)$ μm to 0 μm. In the case of a synthetic quartz glass substrate of 6 inch squares, for example, the coefficient of the 4th term in the annular region is equal to or greater than −0.71 μm, preferably from −0.71 μm to 0 μm.

It is preferred from the standpoint associated with the magnitude of a coefficient of each term that the back surface have a flatness of equal to or less than $(2R/100,000\times 2)$ μm, more preferably equal to or less than $(2R/100,000\times 1)$ μm in a circular region delineated by a circle having a radius R wherein L2−2R≥10 mm.

Next, the 5th to 8th terms which are asymmetry components are terms that cause nonlinear distortion or twist during suction holding or imprint pressing, and all these terms are preferably of smaller values.

The 5th to 8th terms are terms of central asymmetry components and respectively represent asymmetric components excluding concentric highly symmetric shape of the 4th term. Each of these components represents a different shape for each term. As viewed on a single component, an asymmetric deformation different from central symmetry equi-tuple deformation is induced, and a shift from the simple linear correction occurs, rendering correction difficult. Therefore, it is believed that actually these components are combined, leading to complex distortion or local deformation which cannot be corrected in the imprint mold. Therefore, absolute values of coefficients of the 5th to 8th terms are preferably equal to or less than the absolute value of a coefficient of the 4th term. The shape wherein a coefficient of each term is 0 is the best.

When approximation analysis is performed from the 1st to 8th term in the Zernike polynomials on the circular region 2 delineated by a circle having a radius R from the substrate center O, coefficients of the 5th to 8th terms are preferably from $-(2R/100,000\times 1)$ μm to $(2R/100,000\times 1)$ μm, more preferably from $-(2R/100,000\times 0.5)$ μm to 0 μm. In the case of a synthetic quartz glass substrate of 6 inch squares, for example, the coefficients are preferably from −1.42 μm to 1.42 μm, more preferably from −0.71 μm to 0 μm.

Further, the summation of absolute values of coefficients of the 5th to 8th terms is equal to or less than $4\times(2R/100,000\times 1)$ μm, more preferably from $4\times(2R/100,000\times 0.5)$ μm to 0 μm. In the case of a synthetic quartz glass substrate of 6 inch squares, for example, the summation is preferably equal to or less than 5.68 μm, more preferably from 2.84 μm to 0 μm.

For the stepped substrate, when approximation analysis is performed from the 1st to 8th term in the Zernike polynomials on a region that is equal to the circular region minus the stepped region, coefficients of the 5th to 8th terms are preferably equal to or greater than $-(2R/100,000\times 0.6)$ μm, more preferably from $-(2R/100,000\times 0.3)$ μm to 0 μm. In the case of a synthetic quartz glass substrate of 6 inch squares, for example, the coefficients are preferably equal to or more than −0.86 μm, more preferably from −0.43 μm to 0 μm.

Further, the summation of absolute values of coefficients of the 5th to 8th terms is preferably equal to or less than $4-(2R/100,000\times 0.6)$ μm, more preferably from $4-(2R/100,000\times 0.3)$ μm to 0 μm. In the case of synthetic quartz glass substrate of 6 inch squares, for example, the summation is preferably equal to or less than 3.41 μm, more preferably from 1.71 μm to 0 μm.

Like the 4th term, when approximation analysis is performed from the 1st to 8th term in the Zernike polynomials on the annular region which is delineated between an arbitrary circle having a radius R1 and a concentric circle having a radius R2 wherein R2−R1=10 mm, within a region that is equal to the circular region minus the stepped region, coefficients of the 5th to 8th terms are preferably in the range from −(2R/100,000×0.2) μm to (2R/100,000×0.2) μm, more preferably in the range from −(2R/100,000×0.1) μm to (2R/100,000×0.1) μm. In the case of a synthetic quartz glass substrate of 6 inch squares, for example, the coefficients are preferably from −0.28 μm to 0.28 μm, more preferably from −0.14 μm to 0.14 μm.

Further, the summation of absolute values of coefficients of the 5th to 8th terms is preferably equal to or less than 4×(2R/100,000×0.2) μm, more preferably from 4×(2R/100,000×0.1) μm to 0 μm. In the case of a synthetic quartz glass substrate of 6 inch squares, for example, the summation is preferably equal to or less than 1.14 μm, more preferably from 0.57 μm to 0 μm.

It is noted that since the Zernike polynomials are approximation at the most, the shape represented by the polynomials from the 1st to 8th terms produces a differential from the back surface shape of an actual imprint mold-forming synthetic quartz glass substrate. Since this differential commonly known as "residual" further includes asymmetric and symmetric components of the 9th, 10th and higher terms, the differential should be restricted so as not to exceed a certain value.

A blank substrate for the imprint mold-forming substrate, which is not particularly limited, may be prepared, for example, by molding synthetic quartz glass into a desired shape, annealing, slicing the glass to a desired thickness, lapping sliced surfaces, optionally polishing the outer periphery, rough polishing and precision polishing. The polishing procedure may be either double-side or single-side polishing. In general, the double-side polishing is preferable in finishing the thickness variation and flatness of a substrate at a high accuracy. The polishing procedure includes plural polishing steps known as rough polishing and precision polishing. In each polishing step, the surface roughness (Ra), surface defectiveness and shape are controlled by a suitable choice of abrasive, polishing pad, and polishing rate.

The blank substrate should preferably have a surface roughness (Ra) of up to 0.3 nm, more preferably up to 0.2 nm, because the substrate comes in direct contact with the recipient. Since the imprinting step is based on direct contact of the imprint mold with the recipient for transferring the pattern to the recipient, defects are also transferred on an equi-scale. It is thus required that the number of defects as detected over the entire blank substrate front surface at a detection sensitivity of 150 nm using standard particles of polystyrene latex (PSL) be preferably up to 10, more preferably 0. Further, from the standpoint of stability of deformation shape over the entire substrate by back surface suction holding during imprinting, the back surface shape is preferably a generally convex shape with high central symmetry.

As the abrasive, silicon carbide, alumina, ceria, zirconia, manganese oxide, and colloidal silica are generally used. In the final precise polishing step, colloidal silica based abrasive is preferred. The abrasive preferably has an average grain size of up to 100 nm, more preferably up to 80 nm.

The polishing pad may be selected from various commonly used polishing pads of suede, non-woven fabric, and expanded polyurethane type. The suede type pad is most preferred because both roughness and defect quality are met.

To obtain a blank substrate whose back surface shape is a generally convex shape of high central symmetry, the polishing profile is preferably monitored and controlled from the rough polishing step to the precise polishing step. Specifically, the rough polishing step using an abrasive cloth with a high hardness is largely affected by the shape of a polishing plate. Depending on the shape of upper and lower plates, the shape of substrate front and back surfaces may develop as a combination of concave/convex, convex/concave, concave/concave, or convex/convex. Particularly in the rough polishing step, the shape of the polishing plate is important.

In plural stages of the subsequent precise polishing step, an abrasive cloth with a relatively low hardness is used in order to improve surface roughness and defect quality. Then the precise polishing is less susceptible to the influence of the polishing plate. Because of an abrasive cloth with a low hardness, the substrate is much polished on the outer periphery, with the tendency that the substrate becomes rather convex as a whole. In the precise polishing step, the polishing allowance becomes smaller and the shape change becomes smaller at later stages for the purposes of improving sub-surface quality such as surface roughness and surface defectiveness without degrading flatness.

In order that a substrate back surface take a generally convex shape of high central symmetry, the plate shape in the rough polishing step is preferably such that the upper plate has a convexing shape and the lower plate has a nearly flat shape or slightly concaving shape. With the plates of such design, the substrate is polished with the front surface flattened and the back surface convexed. A substrate having front and back surfaces of different shapes can also be produced by combining plate shapes having different degrees of convexity/concavity, and reversing the substrate plural tines during the rough polishing step.

With the differential between the back surface shape at the end of the rough polishing step and the back surface shape after precise polishing being taken into account, the shape is determined such that the flatness of the entire back surface during the rough polishing step is preferably up to 2 μm, more preferably up to 1.5 μm, so as to reach an optimum back surface shape at the end of the precise polishing step. If the degree of convexing of the final shape after rough polishing is too large, the 4th term of analysis according to the Zernike polynomials becomes of a greater negative value, which indicates that the amount of correction necessary for the subsequent precise polishing becomes large, leading to difficulty or impossibility of correction.

Although the back surface shape of an imprint mold-forming blank substrate is mainly prescribed above, preferably the flatness of the front surface is achieved at the same time, like the substrates for photomasks in the IC application, because the imprint mold process involves contact and transfer of a convex/concave shape on the front surface so that the flatness of the front surface affects the accuracy of a convex/concave shape after transfer.

Once the blank substrate thus prepared is cleaned, a film of a metal such as Cr, Cu, Mo or Ni, metal oxide or metal nitride is deposited on the substrate by a standard method such as evaporation or sputtering. The film thus deposited preferably has a thickness of up to 200 nm, more preferably 10 to 50 nm.

Next a photoresist is applied onto the metal or metal oxide film on the blank substrate. The photoresist may be either of positive or negative tone. Preferably positive tone resist is used from accuracy and environmental considerations. The resist is selected from resist materials for EB, EUV, ArF, KrF, i-line, and g-line lithography, depending on a particular exposure wavelength. The thickness of the resist film is generally selected in the range from several nanometers to several tens of microns. The application method may be selected from spin coating, spray coating, slit coating, and the like although spin coating is recommended for uniform coating.

On use of an exposure tool, a photomask having a desired pattern and alignment mark is furnished. In the case of direct writing, data of a desired pattern are programmed. On use of the exposure tool, the blank substrate having the metal or metal oxide film and the resist film deposited thereon is set on the exposure tool whereupon the resist film is exposed through the pattern of the photomask. The photomask used herein is of greater size than the blank substrate so that the overall area subject to exposure may be covered. Although the size of the photomask and the blank substrate is not particularly limited, a choice is preferably made from 5-7 inch squares and 9 inch squares according to the SEMI standards. In the case of direct writing. EB or laser beam is directly irradiated to the blank substrate having the metal or metal oxide film and the resist film deposited thereon just at the desired pattern sites, thereby forming a pattern. After exposure is made in a dose corresponding to the type and thickness of the resist film, the resist film is developed in a developer, rinsed with deionized water, and dried.

Thereafter, the metal, metal oxide or metal nitride film is etched, for example, by wet etching with chromium etchant, acidic aqueous solution or alkaline aqueous solution, or dry etching with chlorine or fluorine based gas. There is obtained the desired metal, metal oxide or metal nitride pattern. The blank substrate is etched through this pattern, obtaining the imprint mold-forming synthetic quartz glass substrate having the convex/concave patterned portion.

The imprint mold-forming substrate may be etched either by wet etching procedure of dipping the substrate in an aqueous etchant solution containing hydrofluoric acid or sodium fluoride or dry etching procedure of etching with a high frequency activated plasma of fluorine base gas. In either procedure, the glass is etched so as to leave the patterned portion of metal, metal oxide or metal nitride. This results in the structure that the patterned portion of metal, metal oxide or metal nitride becomes a mesa or convex shape.

The next step is to perform contour machining on the imprint mold-forming substrate. The contour machining step is to machine one or more of front surface, back surface, side surface and chamfer of the substrate into the desired shape for the purpose of forming the shape of high accuracy required for imprint mold-forming synthetic quartz glass substrates.

Since the patterned portion above the stepped region of the imprint mold-forming synthetic quartz glass substrate must be protected during the contour machining, a protective film is preferably provided for protecting the patterned portion. The protective film may be a film of a metal such as Cr, Cu, Mo or Ni, or metal oxide or nitride, or a photoresist film of organic compound.

Thereafter, the imprint mold-forming synthetic quartz glass substrate having the patterned portion protected with the protective film is secured to a substrate machining table via a bonding member. The bonding member may be formed of a wax, epoxy or acrylic resin based adhesive or UV curable resin. The table is made of a ceramic, glass or metal material.

Once the imprint mold-forming synthetic quartz glass substrate is secured to the table, contour machining is performed on one or more of the front surface, back surface, side surface and chamfer of the substrate including a part of the patterned portion. For the contour machining, an automatic machining tool such as machining center having the desired shape data programmed therein is used. A rotary grinding wheel is constructed as the spindle of the automatic machining tool having diamond or cubic boron nitride abrasive bonded thereto by electroplating or metal bonding. In view of machining accuracy and productivity, the spindle of the grinding wheel is preferably rotated at 100 to 30,000 rpm more preferably 1,000 to 15,000 rpm. Also in view of machining accuracy and productivity, the grinding speed is preferably 1 to 10,000 mm/min. more preferably 10 to 1,000 mm/min.

During machining, preferably a cutting fluid such as emulsion, water-soluble or oily fluid is concomitantly supplied for cooling and chip removal purposes.

The contour machining may include face grinding for modifying substrate size or improving the flatness of side surface, machining of the chamfer between the front or back surface and the side surface, or drilling of a non-through or through bore. In such machining, a rotary grinding wheel and cutting fluid as mentioned above may be used.

The thus contour-machined imprint mold-forming synthetic quartz glass substrate often has non-mirror surfaces. If necessary, mirror polishing is performed on the machined area of the substrate for the purposes of strength improvement, cleanness improvement and residual stress reduction. Polishing is preferably performed with a rotary polishing pad by bringing the polishing pad in abutment to the substrate under a certain pressure, and moving one or both of the substrate and the polishing pad so as to induce relative oscillation therebetween. Although an abrasive pre-coated pad is sometimes used, the rotary polishing pad is preferably operated while feeding an abrasive slurry. The rotary polishing pad has an effective polishing part made of expanded polyurethane, ceria-impregnated polyurethane, zirconia-impregnated polyurethane, non-woven fabric, suede, rubber, or wool felt. The material of the polishing part is not particularly limited as long as a workpiece can be polished.

When the polishing is performed while feeding an abrasive slurry, the slurry is typically a water slurry of abrasive grains, preferably having a grain size of 10 nm to 10 μm, such as silica, ceria, alundum, white alundum (WA), alumina, zirconia, SiC, diamond, titania or germania. For forcing the polishing pad in abutment to the substrate under a certain pressure, a pressing mechanism such as pneumatic piston or load cell may be used.

The substrate as contour machined is cleaned, if necessary. For the cleaning, a choice may be made among acidic aqueous solutions (e.g., sulfuric acid, hydrofluoric acid, nitric acid, hydrochloric acid, oxalic acid, and acetic acid), mixed acid aqueous solutions, alkaline aqueous solutions (e.g., sodium hydroxide, potassium hydroxide and surfactant) and organic solvents (e.g., xylene, acetone and alcohol), followed by rinsing with deionized water.

The imprint mold-forming synthetic quartz glass substrate after cleaning is inspected by visual inspection or a flaw inspection system. For inspection of defects of the order of 150 nm, an inspection system M1320, M3350 or M6640 from Lasertec Corp. is used.

The imprint mold-forming synthetic quartz glass substrate thus obtained preferably has a flatness of up to 1 µm, more preferably up to 0.1 µm, in the patterned region on the front surface, from the standpoint of high accuracy shape transfer of the imprint pattern.

EXAMPLES

Examples of the invention are given below by way of illustration, but not by way of limitation.

Example 1

A synthetic quartz glass substrate of 6 inch (152 mm) squares was furnished as the imprint mold-forming blank substrate. It was lapped, polished and cleaned on the front and back surfaces, yielding a substrate having a flatness of 1.121 µm in a region of 142 mm squares on the back surface.

The shape of the back surface of the substrate was measured by Tropel UltraFlat system (Corning Inc.). When the Zernike analysis was performed on the circular region delineated on the back surface by a circle of radius 60 mm from the substrate center, a coefficient of the 4th term was −0.344 µm, coefficients of the 5th to 8th terms were 0.004 to 0.042 µm, and the summation of absolute values was 0.073 µm. It was demonstrated that a substrate having a quite appropriate back surface shape was obtained.

Example 2

On the same blank substrate as in Example 1, a chromium film and a photoresist film were deposited. The resist film was exposed through a photomask and developed to form a pattern of rectangular region 33 mm by 41 mm at the substrate center.

Next, the non-patterned region of the substrate was subjected to wet etching with a hydrofluoric acid aqueous solution containing ammonium fluoride, forming a rectangular pattern with a height of 30 µm.

After etching, the back surface of the synthetic quartz glass substrate was machined to form a step in a circular region delineated by a circle of radius 32 mm from the center, followed by cleaning with isopropyl alcohol, hot conc. sulfuric acid, surfactant (PC302C by Kao Corp.), and deionized water.

The shape of the back surface of the substrate was measured by Tropel UltraFlat system (Corning Inc.). The substrate had a flatness of 1.041 µm in a region of 142 mm squares on the back surface. When the Zernike analysis from the 1st to 8th terms was performed on a region that was equal to a circular region delineated by a circle of radius 60 mm minus the stepped region, a coefficient of the 4th term was −0.318 µm, coefficients of the 5th to 8th terms were −0.011 to 0.034 µm, and the summation of absolute values was 0.079 µm. It was demonstrated that a substrate having a quite appropriate back surface shape was obtained.

Example 3

The same substrate as in Example 2, but having a pattern of rectangular region 26 mm by 33 mm formed on the front surface was used. The non-patterned region of the substrate was subjected to wet etching with a hydrofluoric acid aqueous solution containing ammonium fluoride, forming a rectangular pattern with a height of 30 µm.

After etching, the back surface of the synthetic quartz glass substrate was machined to form a step in a circular region delineated by a circle of radius 32 mm from the center, followed by cleaning with isopropyl alcohol, hot conc. sulfuric acid, surfactant (PC302C by Kao Corp.), and deionized water.

The shape of the back surface of the substrate was measured by Tropel UltraFlat system (Corning Inc.). The substrate had a flatness of 0.599 µm in a region of 142 mm squares on the back surface. When approximation analysis was performed from the 1st to 8th terms of the Zernike polynomials on an annular region which is delineated between a circle of radius 35 mm and a circle of radius 45 mm, a coefficient of the 4th term was −0.282 µm, coefficients of the 5th to 8th terms were −0.013 to 0.034 µm, and the summation of absolute values was 0.057 µm.

A coefficient of the 4th term and the summation of absolute values of coefficients of the 5th to 8th terms were measured in annular regions which were shifted 5 mm outward from the original annular region. The results are shown in Table 2.

TABLE 2

| Annular region (R1-R2) | Coefficient of 4th term | Coefficients of 5th to 8th terms | |
|---|---|---|---|
| | | Maximum | Summation of absolute values |
| 35-45 | −0.282 | −0.013~0.034 | 0.057 |
| 40-50 | −0.274 | −0.015~0.032 | 0.069 |
| 45-55 | −0.251 | −0.017~0.032 | 0.067 |
| 50-60 | −0.218 | −0.018~0.031 | 0.066 |
| 55-65 | −0.183 | −0.024~0.031 | 0.078 |
| 60-70 | −0.110 | −0.078~0.030 | 0.084 |

The coefficient of the 4th term is fully small as seen from an absolute value of 0.282 at maximum, the coefficients of the 5th to 8th terms were −0.028 to 0.034, and the summation of absolute values was 0.057 to 0.084. An acceptable substrate was obtained.

The coefficient of the 4th term in the annular region 35-45 is greater in absolute value than the coefficient of the 4th term in the annular region 60-70, suggesting that a region closer to the center within the region that is equal to the circular region minus the stepped region has a greater tilt.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An imprint mold-forming synthetic quartz glass substrate of rectangular shape having a longitudinal dimension L1 and a lateral dimension L2 wherein L1≥L2, the substrate having a front surface where a mold pattern is to be formed, a back surface opposed thereto, and a center, wherein when approximation analysis is performed from the 1st to 8th term in the Zernike polynomials on a circular region which is delineated on the back surface by a circle having a radius R from the substrate center wherein L2−2R≥10 mm, a coefficient of the 4th term is equal to or greater than −(2R/100,000×1) µm.

2. The substrate of claim 1 wherein in the approximation analysis performed from the 1st to 8th term in the Zernike polynomials on the circular region, coefficients of the 5th to 8th terms are in the range from −(2R/100,000×1) µm to (2R/100,000×1) µm.

3. The substrate of claim 1 wherein in the approximation analysis performed from the 1st to 8th term in the Zernike polynomials on the circular region, the summation of absolute values of coefficients of the 5th to 8th terms is equal to or less than $4 \times (2R/100,000 \times 1)$ µm.

4. The substrate of claim 1 which includes a stepped region in the circular region, a step being machined in the stepped region.

5. The substrate of claim 4 wherein the step is a non-through bore or through bore.

6. The substrate of claim 5 wherein when approximation analysis is performed from the 1st to 8th term in the Zernike polynomials on an annular region which is delineated between an arbitrary circle having a radius R1 and a concentric circle having a radius R2 wherein R2−R1=10 mm, within a region that is equal to the circular region minus the stepped region, the summation of absolute values of coefficients of the 5th to 8th terms is equal to or less than $4 \times (2R/100,000 \times 0.2)$ µm.

7. The substrate of claim 4 wherein when approximation analysis is performed from the 1st to 8th term in the Zernike polynomials on a region that is equal to the circular region minus the stepped region, a coefficient of the 4th term is equal to or greater than $-(2R/100,000 \times 0.6)$ µm.

8. The substrate of claim 4 wherein when approximation analysis is performed from the 1st to 8th term in the Zernike polynomials on a region that is equal to the circular region minus the stepped region, coefficients of the 5th to 8th terms are equal to or greater than $-(2R/100,000 \times 0.6)$ µm.

9. The substrate of claim 4 wherein when approximation analysis is performed from the 1st to 8th term in the Zernike polynomials on a region that is equal to the circular region minus the stepped region, the summation of absolute values of coefficients of the 5th to 8th terms is equal to or less than $4 \times (2R/100,000 \times 0.6)$ µm.

10. The substrate of claim 4 wherein when approximation analysis is performed from the 1st to 8th term in the Zernike polynomials on an annular region which is delineated between an arbitrary circle having a radius R1 and a concentric circle having a radius R2 wherein R2−R1=10 mm, within a region that is equal to the circular region minus the stepped region, a coefficient of the 4th term is equal to or greater than $-(2R/100,000 \times 0.5)$ µm.

11. The substrate of claim 4 wherein when approximation analysis is performed from the 1st to 8th term in the Zernike polynomials on an annular region which is delineated between an arbitrary circle having a radius R1 and a concentric circle having a radius R2 wherein R2−R1=10 mm, within a region that is equal to the circular region minus the stepped region, coefficients of the 5th to 8th terms are in the range from $-(2R/100,000 \times 0.2)$ µm to $(2R/100,000 \times 0.2)$ µm.

* * * * *